(12) United States Patent
Roff et al.

(10) Patent No.: US 8,319,504 B2
(45) Date of Patent: Nov. 27, 2012

(54) TUNER CHARACTERIZATION METHODS AND APPARATUS

(75) Inventors: Christopher J. Roff, Haslemere (GB); Basim H. Noori, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 599 days.

(21) Appl. No.: 12/475,251

(22) Filed: May 29, 2009

(65) Prior Publication Data

US 2010/0301875 A1   Dec. 2, 2010

(51) Int. Cl.
 *G01R 27/04* (2006.01)
(52) U.S. Cl. .................................. 324/638; 324/629
(58) Field of Classification Search .................. 324/629, 324/638
See application file for complete search history.

(56) References Cited

U.S. PATENT DOCUMENTS

| | | | |
|---|---|---|---|
| 5,274,333 A * | 12/1993 | Ghannouchi et al. | 324/638 |
| 6,297,649 B1 * | 10/2001 | Tsironis | 324/642 |
| 6,850,076 B2 * | 2/2005 | Tsironis | 324/637 |
| 7,135,941 B1 * | 11/2006 | Tsironis | 333/17.3 |
| 7,486,067 B2 * | 2/2009 | Bossche | 324/76.22 |
| 7,646,267 B1 * | 1/2010 | Tsironis | 333/263 |
| 7,646,268 B1 * | 1/2010 | Tsironis | 333/263 |
| 7,795,989 B2 * | 9/2010 | Scuderi et al. | 333/17.3 |
| 8,212,628 B1 * | 7/2012 | Tsironis | 333/17.3 |
| 2003/0122633 A1 | 7/2003 | Tsironis | |
| 2008/0315946 A1 * | 12/2008 | Rawlins et al. | 330/124 R |

OTHER PUBLICATIONS

Focus Microwaves, Application Note 15, Focus Microwaves, Quebec, Jan. 1995.
Focus Microwaves, Application Note 8, Focus Microwaves, Quebec, Jun. 1994.

* cited by examiner

*Primary Examiner* — Jeff Natalini
(74) *Attorney, Agent, or Firm* — Sherry W. Schumm

(57) ABSTRACT

Embodiments include methods and apparatus for characterizing a tuner. For a given tuner, a processing system is adapted to measure scattering parameters for a plurality of characterization points that are non-uniformly distributed across a Smith chart, and to store the scattering parameters in a tuner characterization file. Interpolation and extrapolation processes are performed to determine additional scattering parameters for a plurality of additional characterization points, which are also stored in the tuner characterization file.

17 Claims, 10 Drawing Sheets

TUNER CHARACTERIZATION METHODS AND APPARATUS

TECHNICAL FIELD

Embodiments relate to methods and apparatus for characterizing tuners, and more particularly to characterizing load-pull tuners.

BACKGROUND

Characterization of a device (e.g., a transistor or other active device) adapted to operate at radio or microwave frequencies may be performed using a load-pull measurement technique. "Load-pull" refers to a technique in which the load (or source) impedance presented to a device-under-test (DUT) is modified using a tuner. A "load-pull tuner" is a passive component that may be used to present a range of impedances (or reflection coefficients) to the DUT, where the presented impedance is a function of the physical position of the tuner's internal components. In order for a load-pull tuner to present a load impedance to the DUT, for example, the tuner is connected to the output of the DUT. The tuner may then cause part of a signal transmitted by the DUT to be reflected back to the DUT with a modified amplitude and phase. The reflected signal interacts with the transmitted signal, thus modifying the operation of the DUT (e.g., the gain or the output power).

A typical load-pull tuner includes a horizontally-oriented, slotted airline and one or more mobile carriages that are slidably engaged with the slotted airline. Each mobile carriage includes a probe, which may be inserted into and withdrawn from the slotted airline. The reflection coefficient presented to the DUT, which may be expressed using S-parameters (or "scattering" parameters), is dependent upon the physical position of the probe in relation to the slotted airline. A probe's physical position may be defined by the horizontal position of the mobile carriage along the slotted airline and the vertical position of the probe above the slotted airline.

Before using a load-pull tuner to test DUTs, a characterization process is performed for the tuner. A load-pull tuner characterization process includes repeatedly moving the probe to one of a multitude of physical positions, applying a signal at a given test frequency to an input end of the slotted airline, measuring the S-parameters with a vector network analyzer (VNA), and storing the measured S-parameters for that particular physical position in a characterization table specific to that load-pull tuner. For example, a typical, non-interpolation based characterization process for a single test frequency may include measuring S-parameters at thousands (e.g., 3000-5000 or more) of probe positions. The time to complete such a characterization process may be on the order of hours (e.g., 3-5 hours or more). When the load-pull tuner is characterized for more than one frequency, the total time to complete the characterization process roughly equals the characterization time for a single frequency multiplied by the number of frequencies for which the characterization procedure is performed. As the above discussion indicates, load-pull tuner characterization processes are very time consuming, particularly when the load-pull tuner is characterized for multiple frequencies.

Various types of DUTs may be tested using a load-pull tuner, including high power amplifiers, low noise amplifiers, mixers, receivers, and small signal amplifiers, for example. An initial load-pull tuner characterization process may be performed before the load-pull tuner is first utilized to test DUTs. Additional load-pull tuner characterization processes may be performed periodically or occasionally after that point (e.g., on a monthly basis or after testing a given number of DUTs). Once a load-pull tuner has been characterized (i.e., the characterization table is complete), the load-pull tuner may be connected to the input or output of a DUT. The test protocol may specify one or more user-defined impedances to be presented at the input or output of the DUT, and the data within the characterization table may be accessed to position the carriage and probe to achieve the user-defined impedances.

DETAILED DESCRIPTION

Embodiments described herein include methods and apparatus for characterizing a tuner. Although the description herein may refer to characterizing "load-pull" tuners, it is to be understood that the various embodiments also may be applied to characterizing "source-pull" tuners and/or other types of tuners (e.g., tuners adapted to perform noise characterization, among other things).

Device manufacturing productivity is inversely affected by the amount of time it may take to characterize a load-pull tuner that will be used to test devices. With the ever present trend toward increasing productivity, what are needed are methods for characterizing load-pull tuners that are less time consuming when compared with traditional characterization methods. Also needed are apparatus adapted to perform such methods. The various embodiments may provide one or more advantages over traditional tuner characterization methods and apparatus. For example, embodiments may enable a set of accurate, densely-distributed characterization points across a Smith chart to be determined in a significantly shorter time period than is possible using traditional, non-interpolation based characterization methods and apparatus. In addition, when interpolation between characterization points is implemented, embodiments may result in more accurate interpolation between measured characterization points within certain regions of the Smith chart. Accordingly, embodiments may enable the generation of a densely populated set of highly-accurate impedance points across a Smith chart in a significantly shorter time period than is possible using traditional methods and apparatus.

Figure 1:
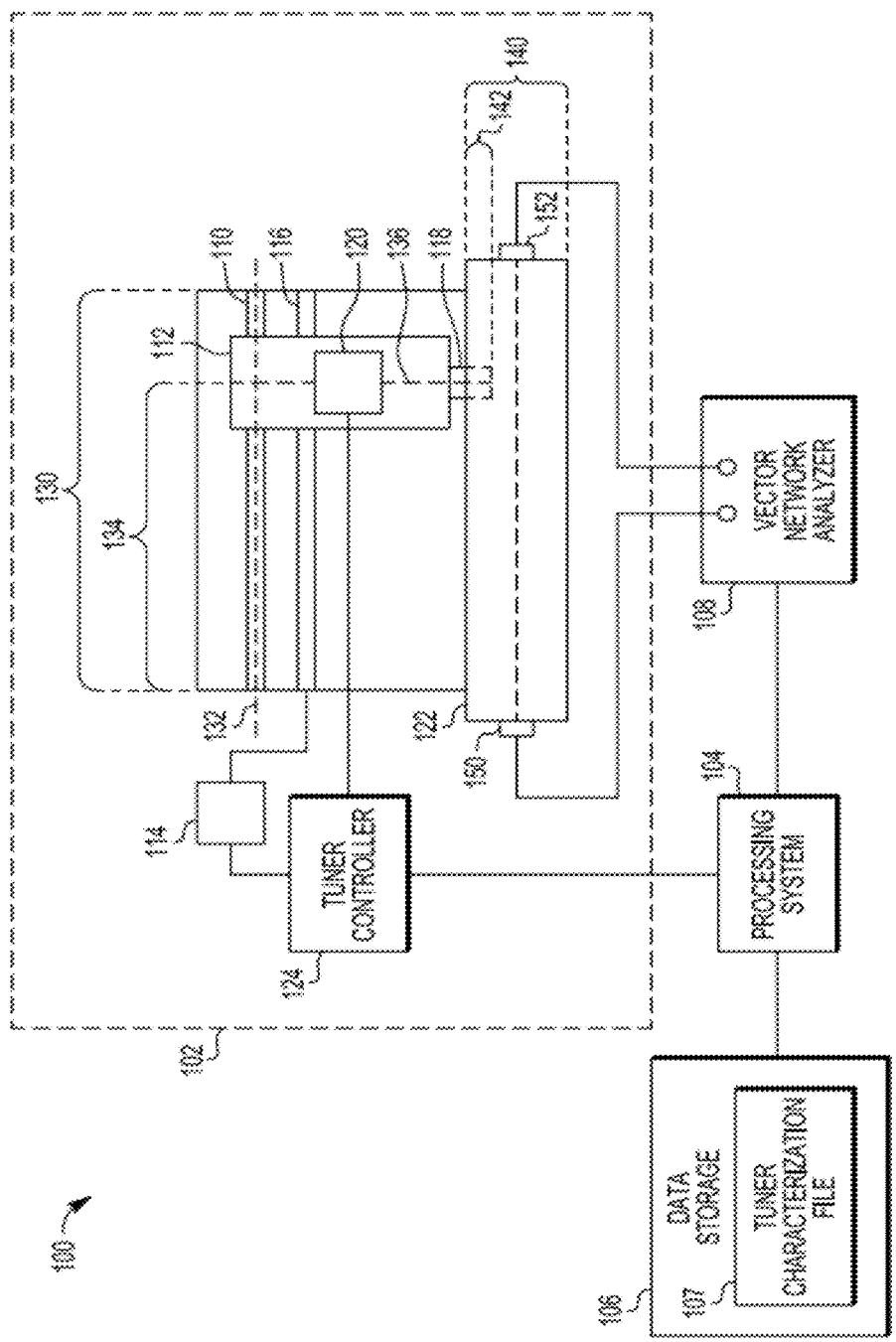
FIG. 1 illustrates a simplified block diagram of a tuner calibration setup, in accordance with an example embodiment.

FIG. 1 illustrates a simplified block diagram of a tuner calibration setup 100, in accordance with an example embodiment. The setup 100 includes a load-pull tuner 102, a processing system 104, data storage 106, and a vector network analyzer 108 (VNA). As will be explained in more detail later, the processing system 104 is adapted to control the load-pull tuner 102 to produce a plurality of reflection coefficients represented by characterization points that are non-uniformly distributed across a Smith chart. The VNA 108, which should be calibrated prior to calibration of tuner 102, is adapted to determine S-parameters for each of the presented reflection coefficients, and the processing system 104 is also adapted to correlate each presented reflection coefficient with the measured S-parameters. The correlated reflection coefficients and S-parameters (referred to herein as "characterization data") may be stored in data storage 106 in a retrievable format in the form of a tuner characterization table or tuner characterization file, for example. Data storage 106 may include, for example but not by way of limitation, a hard drive, a random access memory (RAM), a read only memory (ROM), a removable storage medium (e.g., a removable compact disk, a USB port connectable storage device, or another removable medium), or a network-connected storage medium. The characterization data may later be used during the testing of a device-under-test (DUT) (not illustrated) to cause the load-pull tuner 102 to present one or more user-defined impedances at the input or output of the DUT. The load-pull tuner 120, processing system 104, and VNA 108 may communicate with each other using one or more known bus communication protocols (e.g., a General Purpose Interface Bus (GPIB) protocol, a Universal Serial Bus (USB) protocol, a Transmission Control Protocol-Internet Protocol (TCP-IP) protocol, or another bus communication protocol).

The load-pull tuner 102 may be an automatic coaxial tuner or a waveguide tuner, in various systems. Load-pull tuner 102 includes one or more horizontally-oriented shafts 110, a carriage 112, a carriage positioning mechanism 114, 116, a probe 118, a probe positioning mechanism 120, a slotted airline 122 (or slabline), and a tuner controller 124. All of these components may be substantially contained within and supported by a housing (not illustrated) of the load-pull tuner 102. Shaft 110 is adapted to support carriage 112 in a manner that carriage 112 may be slid to any position along a length 130 of the shaft 110 (i.e., along horizontal axis 132). For example, carriage 112 is shown to be positioned a distance 134 from a left-hand end of shaft 110. Although only one shaft 110 is illustrated in FIG. 1, two or more shafts may be used to support the carriage 112 in other systems.

The position of carriage 112 along shaft 110 is controlled by carriage positioning mechanism 114, 116. For example, the carriage positioning mechanism 114, 116 may include a rotary actuator 114 and a lead screw 116. In such a system, carriage 112 includes an engagement mechanism (not illustrated), through which the screw 116 is engaged with the carriage 112. The rotary actuator 114 is adapted to rotate the screw 116, resulting in movement of the carriage 112 in a horizontal direction along shaft 110. Carriage positioning mechanism 114, 116 may have a 1 to 50 micrometer resolution per motor step, for example, although the resolution may be greater or smaller. Other types of carriage positioning mechanisms (e.g., a belt drive or some other mechanism) may be used to move carriage 112 to various positions along shaft 110, in other systems.

Probe 118 (or "slug") and probe positioning mechanism 120 are located within carriage 112. Probe positioning mechanism 120 is adapted to move probe 112 up and down along a vertical axis 136 that extends through probe 112, in order to adjust the vertical position of probe 118 with respect to airline 122. Probe 118 may be adapted to make ground contact with airline 112, or probe 118 may be a contactless probe. Probe positioning mechanism 120 may include a stepper motor, for example, which may have a 1 to 3 micrometer resolution per motor step, for example, although the resolution may be greater or smaller in other systems. As probe 118 is moved along the vertical axis 136, it may be inserted into airline 122 by varying distances. For example, airline 122 has a cross-sectional depth 140, and probe 118 is shown to be inserted into airline 122 by insertion depth 142. Airline 122 functions as a center conductor, and the position of the probe 118 with respect to the airline 122 affects the amplitude and phase of the reflection factor that will be presented by the load-pull tuner 102 in the presence of an input signal at a given test frequency.

Tuner controller 124 is adapted to control the carriage positioning mechanism 114, 116 and the probe positioning mechanism 120 in order to achieve desired positions of the carriage 112 and the probe 118, respectively. Tuner controller 124 receives control signals from processing system 104, which indicate particular impedances or reflection coefficients, as mentioned previously. Tuner controller 124 then establishes the electrical conditions associated with establishing the user-defined impedances (e.g., motor positions for the carriage and probe positioning mechanisms 114, 120).

In order to characterize tuner 102, input and output ports of VNA 108 are connected to first and second ports 150, 152 on opposite ends of airline 122, and processing system 104 is connected to both the tuner 102 and the VNA 108, as shown in FIG. 1. According to an embodiment, the processing system 104 then retrieves definitions for a plurality of calibration points (e.g., from data storage 106) that are non-uniformly (or irregularly) distributed across a Smith chart, and controls the load-pull tuner 102 to determine a plurality of reflection coefficients (or S-parameters) corresponding to the non-uniformly distributed calibration points. As used herein, the term "measured calibration point" refers to a calibration point on a Smith chart for which measurements of S-parameters are made. The measured calibration points may be referred to herein as "non-uniformly distributed calibration points" or "irregularly distributed calibration points." The definitions for the non-uniformly distributed calibration points may be stored in data storage 106 in the form of a "measured calibration point table," for example. The VNA 108 is adapted to measure S-parameters for each of the measured calibration points, and the processing system 104 is adapted to correlate each measured calibration point with its associated, measured S-parameters. Each measured calibration point may be represented or defined in terms of the associated position of probe 118 or the positions of the motors associated with the carriage and probe positioning mechanisms 114, 120, for example. The measured calibration point definitions and their associated S-parameters (referred to together herein as "measured characterization data") may be stored in data storage 106 within a "tuner characterization file" 107, for example. A separate tuner characterization file 107 may be created for each test frequency, or a single tuner characterization file 107 may be created that includes characterization data for multiple test frequencies.

Along with the characterization data associated with the measured calibration points (i.e., the non-uniformly distributed calibration points in the measured calibration point table), a tuner characterization file 107 also may include characterization data associated with "interpolated" and/or "extrapolated" calibration points. According to an embodiment, the "interpolated" and/or "extrapolated" calibration points include calibration points located between and/or in proximity to the measured calibration points, where the definitions of the interpolated and/or extrapolated calibration points and their associated S-parameters are determined, using interpolation and/or extrapolation techniques, from the measured calibration points and their associated measured S-parameters. For convenience, the term "interpolated calibration points" is used throughout the remainder of this description to refer to both calibration points determined using interpolation techniques and to calibration points determined using extrapolation techniques.

The interpolated calibration point definitions and their associated S-parameters (referred to together herein as "interpolated characterization data") may be stored in data storage 106 within a same tuner characterization file 107 within which the measured characterization data is stored, according to an embodiment. Accordingly, a tuner characterization file 107 for a particular tuner at a particular frequency includes definitions of both measured calibration points and interpolated calibration points. The characterization data within a tuner characterization file 107 may later be used during the testing of a device-under-test (DUT) (not illustrated) to cause the load-pull tuner 102 to present one or more user-defined impedances (or reflection coefficients) at the input or output of the DUT.

Although FIG. 1 depicts only one carriage 114, carriage positioning mechanism 116, probe 118, and probe positioning mechanism 120, it is to be understood that alternate systems may include multiple (e.g., two, three or more) carriages 114, carriage positioning mechanisms 116, probes 118, and probe positioning mechanisms 120. For example, a particular system may include a first carriage and probe (and associated positioning mechanisms) adapted to control the amplitude and phase of the reflection factor at a first frequency, and one or more additional carriages and probes (and associated positioning mechanisms) adapted to control the amplitude and phase of the reflection factor and one or more additional frequencies (e.g., harmonic frequencies of the first frequency).

Figure 2:
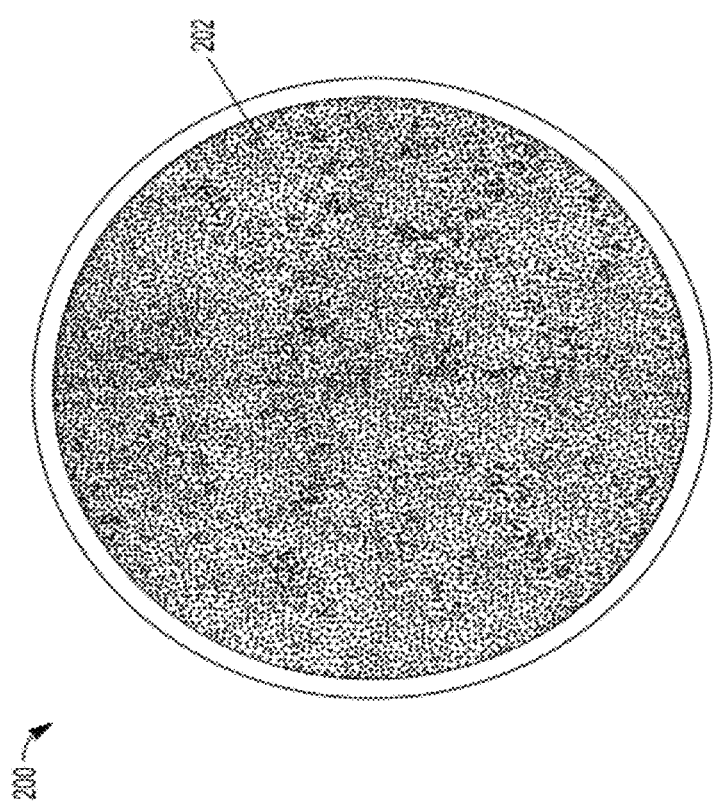
FIG. 2 illustrates an example of a densely-populated Smith chart representing a multitude of impedance points for a particular frequency, according to an example embodiment.

FIG. 2 illustrates an example of a densely-populated Smith chart 200 representing a multitude of impedance points 202 for a particular frequency, according to an example embodiment. As used herein, the term "impedance point" may refer to a calibration point or to a point on a Smith chart that was determined during characterization of a DUT. Smith chart 200 is plotted on the complex reflection coefficient plane in two dimensions and is scaled in normalized impedance. Accordingly, Smith chart 200 may be referred to as a Z Smith chart, according to common terminology in the art. In alternate embodiments, a Smith chart may be employed that is scaled in normalized admittance or both normalized impedance and admittance (e.g., Y or YZ Smith charts). For convenience of description, however, a Z Smith chart, such as Smith chart 200 is used for describing the various embodiments. In addition, example embodiments described herein assume that the characteristic or system impedance is 50 Ohms. Neither the type of Smith chart depicted and described herein nor the example characteristic impedance of 50 Ohms are intended to be limiting, and embodiments also could apply to the use of different types of Smith charts and/or different characteristic impedances.

Each impedance point 202 on Smith chart 200 may be converted to a corresponding complex voltage reflection coefficient. In other words, various values of voltage reflection coefficients are expressed on Smith chart 200 using normalized impedance. In the illustrated example embodiment, approximately 3000 impedance points 202 are plotted on Smith chart 200, where each plotted impedance point 202 may be represented by characterization data (e.g., calibration point representations and their associated S-parameters) in a tuner characterization file (e.g., tuner characterization file 107, FIG. 1). In alternate embodiments, more or fewer impedance points 202 may be plotted on a Smith chart, and accordingly more or less characterization data may be included in the associated tuner characterization file. According to a particular embodiment, characterization data for 3000 to 5000 impedance points may be included in a characterization file for a particular tuner and a particular frequency. In an alternate embodiment, characterization data for less than 3000 impedance points may be included in a characterization file. In another alternate embodiment, characterization data for up to 100,000 impedance points may be included in a characterization file. In yet another alternate embodiment, characterization data for up to 1,000,000 impedance points may be included in a characterization file. In yet another alternate embodiment, characterization data for more than 1,000,000 impedance points may be included in a characterization file.

As indicated above, the impedance points 202 in Smith chart 200 represent a charted example of characterization data from a tuner characterization file. According to an embodiment, some of the impedance points 202 correspond to non-uniformly distributed calibration points for which actual measurements of S-parameters are made, and a remainder of the impedance points 202 correspond to interpolated calibration points, as will be described in detail below. According to an embodiment, a percentage of measured, non-uniformly distributed calibration points is in a range of less than 0.05 percent to about 50 percent of the total number of impedance points 202 represented in a tuner characterization file. For example, the number of non-uniformly distributed calibration points for which S-parameter measurements may be made may be in a range of about 50 to 1000 characterization points, and the number of interpolated calibration points may be in a range of about 1000 to 1,000,000 characterization points, although the numbers of measured and interpolated calibration points may be in different ranges, as well.

Figure 3:
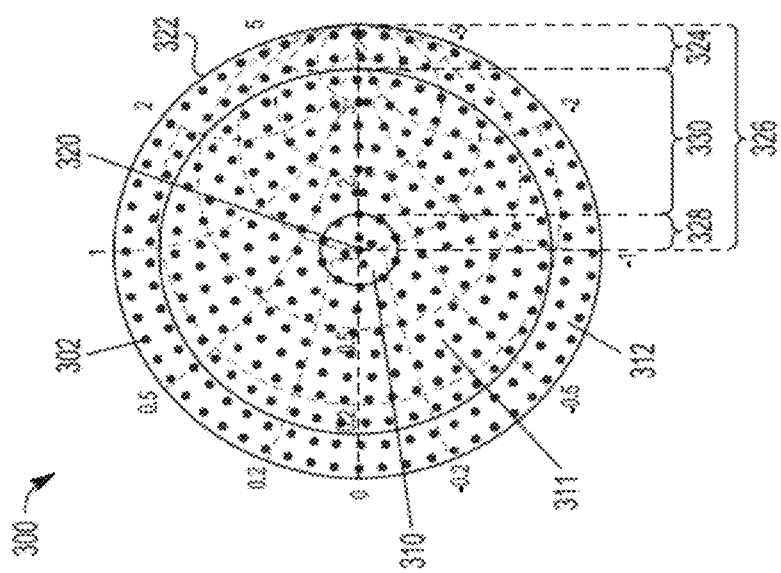
FIG. 3 illustrates an example of a Smith chart representing a plurality of uniformly distributed, measured calibration points.

FIG. 3 illustrates an example of a Smith chart 300 representing a plurality of uniformly distributed, measured calibration points 302. The definitions for the uniformly distributed, measured calibration points 302 may be stored in the form of a measured calibration point table. The number of uniformly distributed, measured calibration points 302 may be, for example, in a range of about 50-100 calibration points, about 100-200 calibration points, about 200-500 calibration points, about 500-1000 calibration points, or more than 1000 calibration points.

As used herein, the terms "uniformly distributed" or "regularly distributed," as they relate to the distribution of measured calibration points on a Smith chart, mean that the spatial densities of the measured calibration points across all regions of the Smith chart are substantially equal (i.e., the density in a particular region is substantially equal to the densities in all other regions). Alternatively, the term "uniformly distributed" may mean that the average distance between any particular calibration point and its closest three to six neighboring, adjacent calibration points is substantially equal for substantially all calibration points plotted on the Smith chart. The term "density," as it applies to a plurality of calibration points, means a number of calibration points within a fixed-size, two-dimensional area of a Smith chart. In the Smith chart 300 of FIG. 3, calibration points 302 have a uniform density across the Smith chart, meaning that the density within any region is substantially equal to the density within any other region. As used herein, the term "substantially equal" means that a set of two or more values are within 5 to 10 percent of each other.

A "region" of Smith chart 300 may be defined as one of a plurality of concentric rings 310, 311, 312, with the center of each ring corresponding to the center 320 (or origin) of the Smith chart 300, according to an embodiment. The plurality of concentric rings 310-312 encompasses substantially the entire Smith chart 300, according to an embodiment. An outer concentric ring 312 (also referred to as a "peripheral concentric ring" or a "peripheral region"), which has an outer edge 322 that substantially coincides with the outer perimeter of the Smith chart 300, has a width 324 in a range of about 10 to 25 percent of a radius 326 of the Smith chart, according to an embodiment. According to another embodiment, the outer concentric ring 312 may be defined in terms of a range of reflection coefficients encompassed by the outer concentric ring 312. For example, outer concentric ring 312 may encompass reflection coefficients, $\gamma$, between a lower boundary of about 0.8 and an upper boundary of about 1.0 (e.g., $0.8 \leq \gamma < 1.0$), according to an embodiment. According to other embodiments, outer concentric ring 312 may encompass reflection coefficients between a different lower boundary (e.g., a lower boundary in a range of about 0.5 and 0.95) and the upper boundary of about 1.0.

An inner concentric ring 310 (also referred to as a "central concentric ring" or a "central region"), which encompasses the center 320 of the Smith chart 300, has a radius 328 in a range of about 10 to 25 percent of the radius 326 of the Smith chart 300, according to an embodiment. According to another embodiment, the inner concentric ring 310 may be defined in terms of a range of reflection coefficients encompassed by the inner concentric ring 310. For example, inner concentric ring 310 may encompass reflection coefficients between a lower boundary of about 0.0 and an upper boundary of about 0.2 (e.g., $0.0 \leq \gamma < 0.2$), according to an embodiment. According to other embodiments, inner concentric ring 310 may encompass reflection coefficients between about 0.0 and a different upper boundary (e.g., an upper boundary in a range of about 0.1 and 0.3).

An intermediate concentric ring 311 (also referred to as an "intermediate region"), which extends between the inner and outer concentric rings 310, 312, has a width 330 in a range of about 50 to 80 percent of the radius 326 of the Smith chart 300, according to an embodiment. According to another embodiment, the intermediate concentric ring 311 may be defined in terms of a range of reflection coefficients encompassed by the intermediate concentric ring 311. For example, intermediate concentric ring 311 may encompass reflection coefficients between a lower boundary of about 0.2 and an upper boundary of about 0.8 (e.g., $0.2 \leq \gamma < 0.8$), according to an embodiment. According to other embodiments, intermediate concentric ring 311 may encompass reflection coefficients between a different lower boundary (e.g., a lower boundary in a range of about 0.5 and 0.95) and/or a different upper boundary (e.g., an upper boundary in a range of about 0.5 and 0.95).

Figure 4:
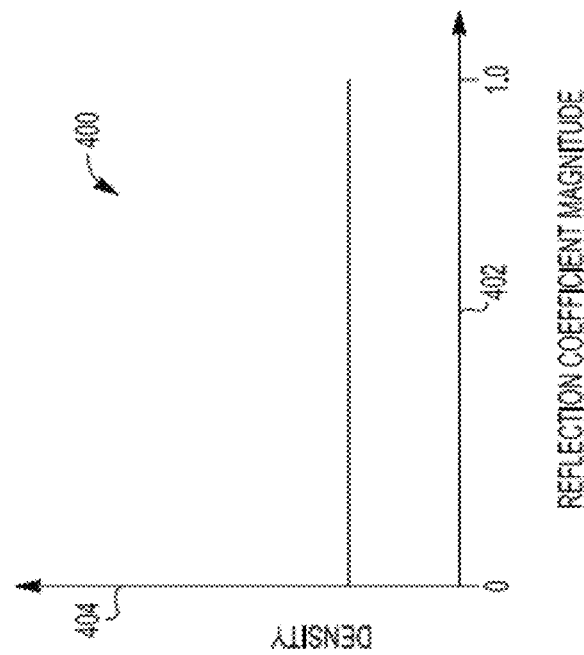
FIG. 4 illustrates a density distribution plot corresponding to uniformly distributed, measured calibration points.

FIG. 4 illustrates a density distribution plot 400 corresponding to uniformly distributed, measured calibration points (e.g., calibration points 302, FIG. 3). More specifically, plot 400 represents reflection coefficient (along axis 402) versus calibration point density (axis 404) for a plurality of uniformly distributed, measured calibration points. As FIG. 4 illustrates, the calibration point density is substantially uniform between the center of the Smith chart (e.g., at a reflection coefficient of zero) and the perimeter of the Smith chart (e.g., at a reflection coefficient of one). In other words, the density within each region of the Smith chart is substantially equal. For example, referring again to FIG. 3, the densities within the inner, intermediate, and outer concentric rings 310-312 are substantially equal to each other.

As will be described in detail below, embodiments include characterizing a tuner (e.g., tuner 102, FIG. 1) using non-uniformly distributed, measured calibration points. The calibration points may be non-uniformly distributed in that they are more densely distributed in a central region of the Smith chart (FIGS. 5 and 9) and/or in a peripheral region of the Smith chart (FIGS. 7 and 9), when compared with the density within an intermediate region of the Smith chart (i.e., a region between the central region and the peripheral region). Various embodiments of non-uniform distributions are described in conjunction with FIGS. 5-9.

Figure 5:
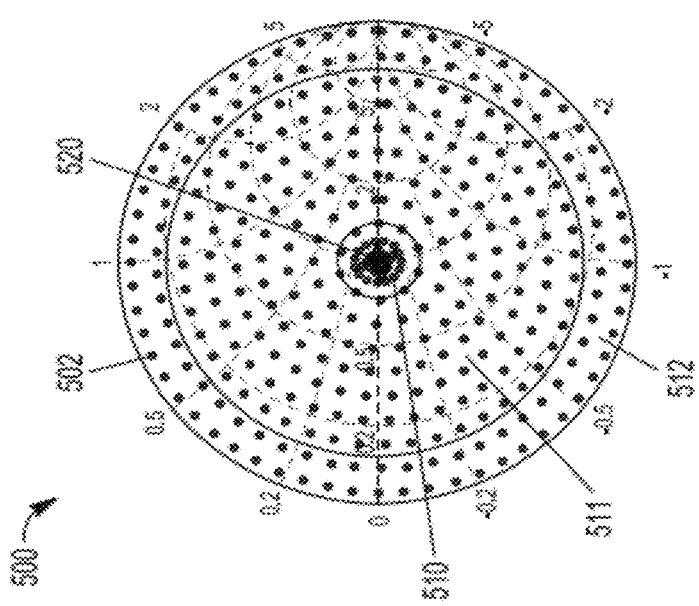
FIG. 5 illustrates an example of a Smith chart representing a plurality of non-uniformly distributed, measured calibration points, according to an example embodiment.

FIG. 5 illustrates an example of a Smith chart 500 representing a plurality of non-uniformly distributed, measured calibration points 502, according to an example embodiment. The number of uniformly distributed, measured calibration points 502 may be, for example, in a range of about 50-100 calibration points, about 100-200 calibration points, about 200-500 calibration points, about 500-1000 calibration points, or more than 1000 calibration points.

As used herein, the terms "non-uniformly distributed" or "irregularly distributed," as they relate to the distribution of measured calibration points on a Smith chart, mean that the spatial densities of the measured calibration points across all regions of the Smith chart are not substantially equal (i.e., the density in a particular region is not substantially equal to the densities in other regions). For example, when calibration points are non-uniformly distributed across a Smith chart, the average distance between any particular calibration point and its closest three to six neighboring, adjacent calibration points is not substantially equal for substantially all calibration points plotted on the Smith chart. As used herein, the term "not substantially equal" means that a set of two or more values are more than 5 to 10 percent different from each other.

Similar to the Smith chart 300 described in conjunction with FIG. 3, a "region" of Smith chart 500 may be defined as one of a plurality of concentric rings 510, 511, 512, with the center of each ring corresponding to the center 520 (or origin) of the Smith chart 500, according to an embodiment. The plurality of concentric rings 510-512, which include an inner concentric ring 510, an intermediate concentric ring 511, and an outer concentric ring 512, encompasses substantially the entire Smith chart 500, according to an embodiment. Each of the inner, intermediate, and outer concentric rings 510-512 may have relative dimensions and orientations as described in conjunction with the corresponding rings 310-312 of FIG. 3.

In contrast with the Smith chart 300 described in conjunction with FIG. 3, however, the measured calibration points 502 depicted in Smith chart 500 are non-uniformly distributed, rather than being uniformly distributed. More particularly, calibration points 502 are non-uniformly distributed because the density of the calibration points 502 within inner concentric ring 510 is higher than the density of the calibration points 502 within the intermediate and outer concentric rings 511, 512. This may correspond, for example, to a relatively-higher density of calibration points 502 around the 50 Ohm impedance region. The term "density," as it applies to a plurality of calibration points, means a number of calibration points within a two-dimensional area of a Smith chart having a given area (e.g., within a hexagon having a width of 1 centimeter). In addition, the term "higher," as it applies to densities, means that a first average density in a region is at least 10 percent higher than a second average density in another region, according to an embodiment. In a particular embodiment, the average density of the calibration points 502 within inner concentric ring 510 is at least 10 percent higher than the average density of the calibration points 502 within the intermediate and outer concentric rings 511, 512. In another embodiment, the average density of the calibration points 502 within inner concentric ring 510 is at least 20 percent higher than the average density of the calibration points 502 within the intermediate and outer concentric rings 511, 512. In yet another embodiment, the average density of the calibration points 502 within inner concentric ring 510 is at least 50 percent higher than the average density of the calibration points 502 within the intermediate and outer concentric rings 511, 512. Because of the differences in average density between regions of Smith chart 500, it may be said that calibration points 502 have a "non-uniform density" across Smith chart 500. As used herein, the term "non-uniform density" means that the average density within one region of a Smith chart is not substantially equal to the average density within at least one other region.

Figure 6:
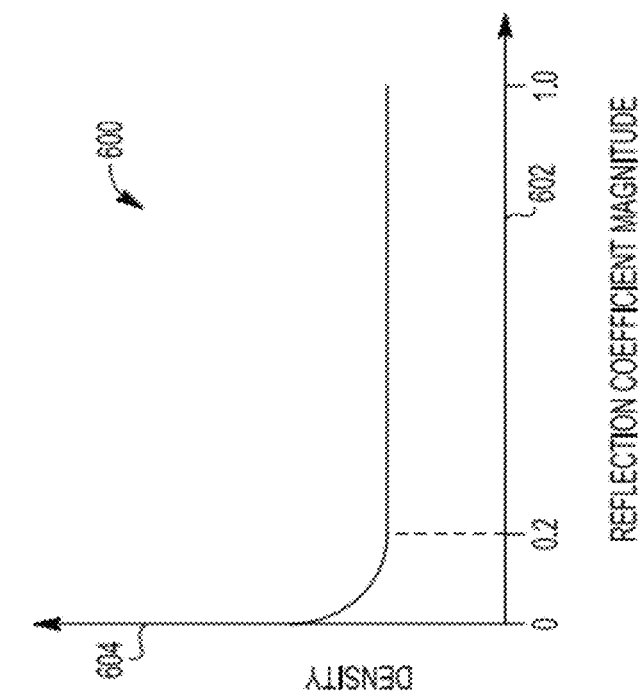
FIG. 6 illustrates a continuous density distribution plot corresponding to non-uniformly distributed, measured calibration points, which are relatively denser within a central region of a Smith chart, according to an embodiment.

FIG. 6 illustrates a continuous density distribution plot 600 corresponding to non-uniformly distributed, measured calibration points (e.g., calibration points 502, FIG. 5) which are relatively denser within a central region of a Smith chart, according to an embodiment. As used herein, the term "continuous" as it relates to a density distribution plot or a densification relationship means that changes in the density of calibration points across a range of reflection coefficient magnitudes (e.g., 0 to 1.0) are continuous. In other words, the calibration point density across the range changes smoothly and without significant magnitude discontinuities. In contrast, the term "stepped" as it relates to a density distribution plot or a densification relationship means that changes in the density of calibration points across a range of reflection coefficient magnitudes includes one or more significant magnitude continuities. Stepped density distribution plots will be discussed in more detail in conjunction with FIGS. 11 and 13, later.

Referring now to FIG. 6, continuous density distribution plot 600 represents reflection coefficient (along axis 602) versus calibration point density (axis 604) for a plurality of non-uniformly distributed, measured calibration points. As FIG. 6 illustrates, the calibration point density is relatively high toward the center of the Smith chart (e.g., at reflection coefficients between zero and 0.2), and is relatively low in an intermediate region of the Smith chart and a peripheral region of the Smith chart (e.g., at reflection coefficients between 0.2 and one). In other words, the density within each region of the Smith chart is not substantially equal. For example, referring again to FIG. 5, the inner concentric ring 510 has a relatively high density, and intermediate and outer concentric rings 511, 512 have relatively lower densities.

According to an embodiment, the relative densities of calibration points (e.g., calibration points 502, FIG. 5) within the intermediate, center, and peripheral regions of the Smith chart (e.g., intermediate, inner, and peripheral concentric rings 511, 510, 512, FIG. 5) may be defined by the following densification relationship:

$$d_I = x;$$

$$d_C = f(\gamma)x; \text{ and}$$

$$d_P = x, \quad \text{(Equations 1)}$$

where $d_I$ is the average density of calibration points within the intermediate region (e.g., intermediate region 511, FIG. 5), $d_C$ is the average density of calibration points within the central region (e.g., central region 510, FIG. 5), $d_P$ is the average density of calibration points within the peripheral region (e.g., peripheral region 512, FIG. 5), x is a density constant having units of calibration points per unit area, $\gamma$ represents the reflection coefficient value on the Smith chart, and $f(\gamma)$ is a first function of $\gamma$. According to an embodiment, $f(\gamma)$ may be an exponential equation (e.g., $f(\gamma) = e^{-2\gamma}$), although $f(\gamma)$ may be another type of equation that may result in a continuous densification relationship across the center, intermediate, and peripheral regions. Although a specific, continuous densification relationship is defined in Equations 1, above, it is to be understood that, in other embodiments, a densification relationship may be defined using other mathematical equations. Accordingly, the above-given example definitions are not intended to be limiting.

In the embodiment illustrated in FIG. 5, the density of the calibration points 502 within the central region of the Smith chart is higher than the density of the calibration points 502 within the intermediate and peripheral regions of the Smith chart. According to another embodiment, as depicted in FIG. 7, the density of the calibration points within the peripheral region of the Smith chart is higher than the density of the calibration points within the central and intermediate regions of the Smith chart.

Figure 7:
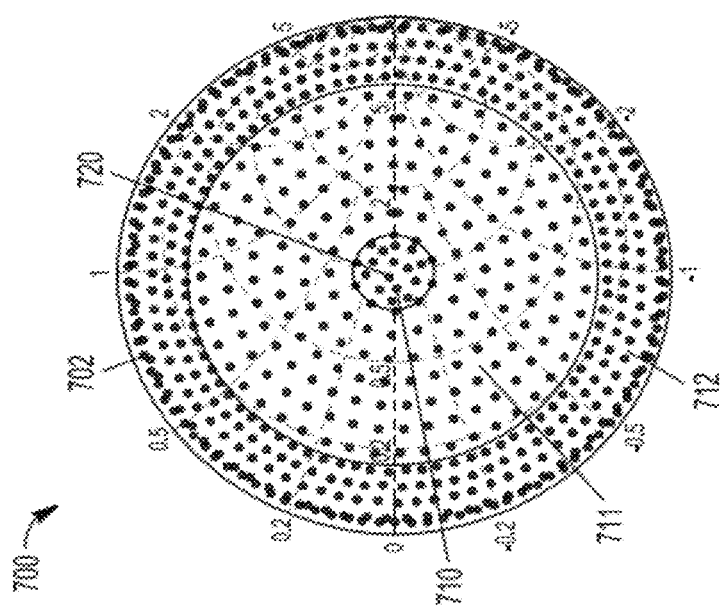
FIG. 7 illustrates an example of a Smith chart representing a plurality of non-uniformly distributed, measured calibration points, according to another example embodiment.

FIG. 7 illustrates an example of a Smith chart 700 representing a plurality of non-uniformly distributed, measured calibration points 702, according to another example embodiment. The number of uniformly distributed, measured calibration points 702 may be, for example, in a range of about 50-100 calibration points, about 100-200 calibration points, about 200-500 calibration points, about 500-1000 calibration points, or more than 1000 calibration points.

Similar to the Smith charts 300, 500 described in conjunction with FIGS. 3 and 5, a "region" of Smith chart 700 may be defined as one of a plurality of concentric rings 710, 711, 712, with the center of each ring corresponding to the center 720 (or origin) of the Smith chart 700, according to an embodiment. The plurality of concentric rings 710-712, which include an inner concentric ring 710, an intermediate concentric ring 711, and an outer concentric ring 712, encompasses substantially the entire Smith chart 700, according to an embodiment. Each of the inner, intermediate, and outer concentric rings 710-712 may have relative dimensions and orientations as described in conjunction with the corresponding rings 310-312 of FIG. 3.

Similar to the Smith chart 500 described in conjunction with FIG. 5, the measured calibration points 702 depicted in FIG. 7 are non-uniformly distributed. In contrast with the Smith chart 500 described in conjunction with FIG. 5, however, the density of the calibration points 702 within outer concentric ring 712 is higher than the density of the calibration points 702 within the inner and intermediate concentric rings 710, 711. In a particular embodiment, the density of the calibration points 702 within outer concentric ring 712 is at least 10 percent higher than the density of the calibration points 702 within the inner and intermediate concentric rings 710, 711. In another embodiment, the density of the calibration points 702 within outer concentric ring 712 is at least 20 percent higher than the density of the calibration points 702 within the inner and intermediate concentric rings 710, 711. In yet another embodiment, the density of the calibration points 702 within outer concentric ring 712 is at least 50 percent higher than the density of the calibration points 702 within the inner and intermediate concentric rings 710, 711. Accordingly, calibration points 702 have a non-uniform density across Smith chart 700.

Figure 8:
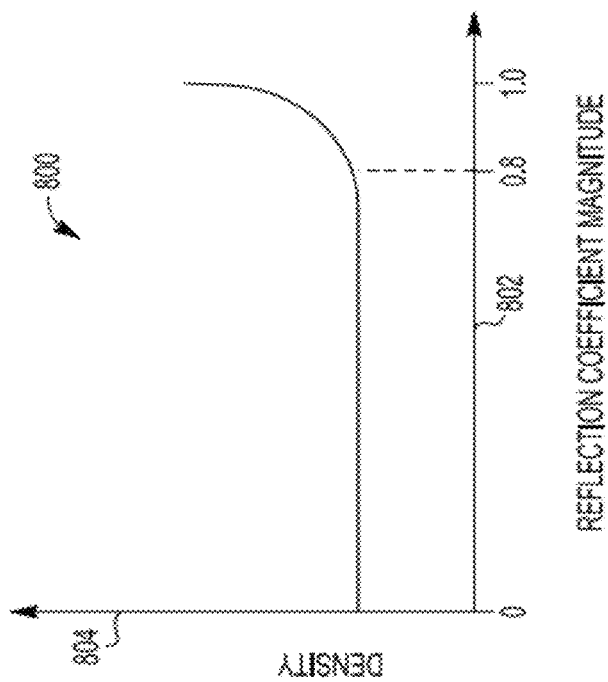
FIG. 8 illustrates a continuous density distribution plot corresponding to non-uniformly distributed, measured calibration points, which are relatively denser within a peripheral region of a Smith chart, according to an embodiment.

FIG. 8 illustrates a continuous density distribution plot 800 corresponding to non-uniformly distributed, measured calibration points (e.g., calibration points 702, FIG. 7) which are relatively denser within a peripheral region of a Smith chart, according to an embodiment. More specifically, plot 800 represents reflection coefficient (along axis 802) versus calibration point density (axis 804) for a plurality of non-uniformly distributed, measured calibration points. As FIG. 8 illustrates, the calibration point density is relatively high toward the periphery of the Smith chart (e.g., at reflection coefficients between 0.8 and 1.0), and is relatively low in inner and intermediate regions of the Smith chart (e.g., at reflection coefficients between 0.0 and 0.8). For example, referring again to FIG. 7, the outer concentric ring 712 has a relatively high density, and inner and intermediate concentric rings 710, 711 have relatively lower densities.

According to an embodiment, the relative densities of calibration points (e.g., calibration points 702, FIG. 7) within the intermediate, center, and peripheral region of the Smith chart (e.g., intermediate, center, and outer concentric rings 711, 710, 712, FIG. 7) may be defined by the following densification relationship:

$$d_I = x;$$

$$d_C = x; \text{ and}$$

$$d_P = g(\gamma)x, \quad \text{(Equations 2)}$$

where $g(\gamma)$ is a second function of $\gamma$. According to an embodiment, $g(\gamma)$ may be an exponential equation (e.g., $g(\gamma) = e^{2\gamma}$), although $g(\gamma)$ may be another type of equation that may result in a continuous densification relationship across the center, intermediate, and peripheral regions. Although a specific, continuous densification relationship is defined in Equations 2, above, it is to be understood that, in other embodiments, a densification relationship may be defined using other mathematical equations. Accordingly, the above-given example definitions are not intended to be limiting In the embodiment illustrated in FIG. 7, the density of the calibration points 702 within the peripheral region of the Smith chart is higher than the density of the calibration points 702 within the inner and intermediate regions of the Smith chart. According to yet another embodiment, as depicted in FIG. 9, the densities of the calibration points within both the inner and peripheral regions of the Smith chart are higher than the density of the calibration points within the intermediate region of the Smith chart.

Figure 9:
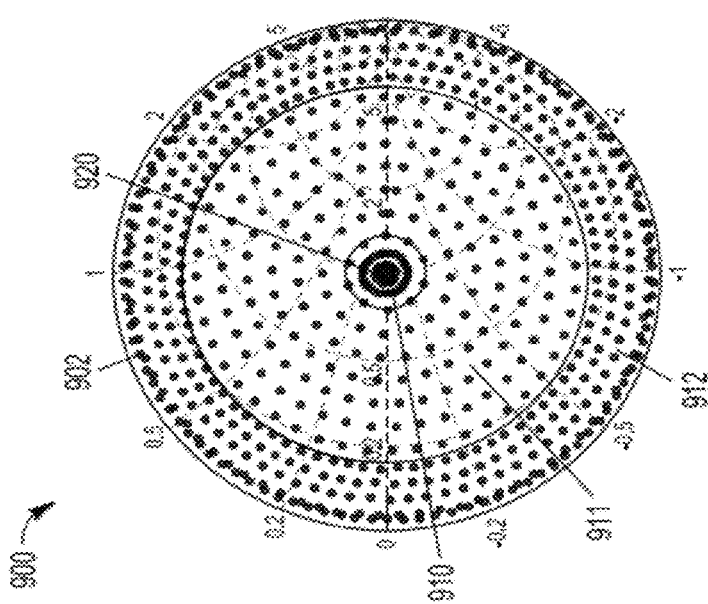
FIG. 9 illustrates an example of a Smith chart representing a plurality of non-uniformly distributed, measured calibration points, according to another example embodiment.

FIG. 9 illustrates an example of a Smith chart 900 representing a plurality of non-uniformly distributed, measured calibration points 902, according to another example embodiment. The number of uniformly distributed, measured calibration points 902 may be, for example, in a range of about 50-100 calibration points, about 100-200 calibration points, about 200-500 calibration points, about 500-1000 calibration points, or more than 1000 calibration points.

Similar to the Smith charts 300, 500, 700 described in conjunction with FIGS. 3, 5, and 7, a "region" of Smith chart 900 may be defined as one of a plurality of concentric rings 910, 911, 912, with the center of each ring corresponding to the center 920 (or origin) of the Smith chart 900, according to an embodiment. The plurality of concentric rings 910-912, which include an inner concentric ring 910, an intermediate concentric ring 911, and an outer concentric ring 912, encompasses substantially the entire Smith chart 900, according to an embodiment. Each of the inner, intermediate, and outer concentric rings 910-912 may have relative dimensions and orientations as described in conjunction with the corresponding rings 310-312 of FIG. 3.

Similar to the Smith charts 500, 700 described in conjunction with FIGS. 5 and 7, the measured calibration points 902 depicted in FIG. 9 are non-uniformly distributed. In contrast with the Smith charts 500, 700 described in conjunction with FIGS. 5 and 7, however, the densities of the calibration points 902 within both the inner concentric ring 910 and the outer concentric ring 912 are higher than the density of the calibration points 902 within the intermediate concentric ring 911. In a particular embodiment, the densities of the calibration points 902 within the inner and outer concentric rings 910, 912 are at least 10 percent higher than the density of the calibration points 902 within the intermediate concentric ring 911. In another embodiment, the densities of the calibration points 902 within inner and outer concentric rings 910, 912 is at least 20 percent higher than the density of the calibration points 902 within the intermediate concentric ring 911. In yet another embodiment, the densities of the calibration points 902 within inner and outer concentric rings 910, 912 is at least 50 percent higher than the density of the calibration points 902 within the intermediate concentric ring 911. Accordingly, calibration points 902 have a non-uniform density across Smith chart 900.

Figure 10:
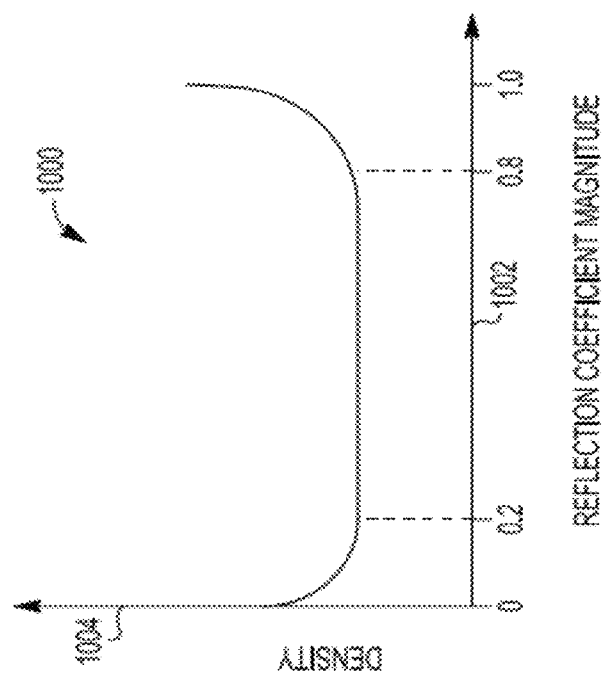
FIG. 10 illustrates a continuous density distribution plot corresponding to non-uniformly distributed, measured calibration points, which are relatively denser within both an central region and a peripheral region of a Smith chart, according to an embodiment.

FIG. 10 illustrates a continuous density distribution plot 1000 corresponding to non-uniformly distributed, measured calibration points (e.g., calibration points 902, FIG. 9) which are relatively denser within both a central region and a peripheral region of a Smith chart, according to an embodiment. More specifically, plot 1000 represents reflection coefficient (along axis 1002) versus calibration point density (axis 1004) for a plurality of non-uniformly distributed, measured calibration points. As FIG. 10 illustrates, the calibration point densities are relatively high toward the center and periphery of the Smith chart (e.g., at reflection coefficients between 0.0 and 0.2 and between 0.8 and 1.0), and is relatively low in an intermediate region of the Smith chart (e.g., at reflection coefficients between 0.2 and 0.8). For example, referring again to FIG. 9, the inner and outer concentric rings 910, 912 have relatively high densities, and intermediate concentric ring 911 has a relatively lower density.

According to an embodiment, the relative densities of calibration points (e.g., calibration points 902, FIG. 9) within the intermediate, center, and peripheral regions of the Smith chart (e.g., intermediate, center, and outer concentric rings 911, 910, 912, FIG. 9) may be defined by the following densification relationship:

$$d_I = x;$$

$$d_C = f(\gamma)x; \text{ and}$$

$$d_P = g(\gamma)x. \quad \text{(Equations 3)}$$

According to an embodiment, $f(\gamma)$ and $g(\gamma)$ are symmetrical equations, although they may be asymmetrical equations, in other embodiments. Once again, although a specific, continuous densification relationship is defined in Equations 3, above, it is to be understood that, in other embodiments, a densification relationship may be defined using other mathematical equations. Accordingly, the above-given example definitions are not intended to be limiting.

Figure 11:
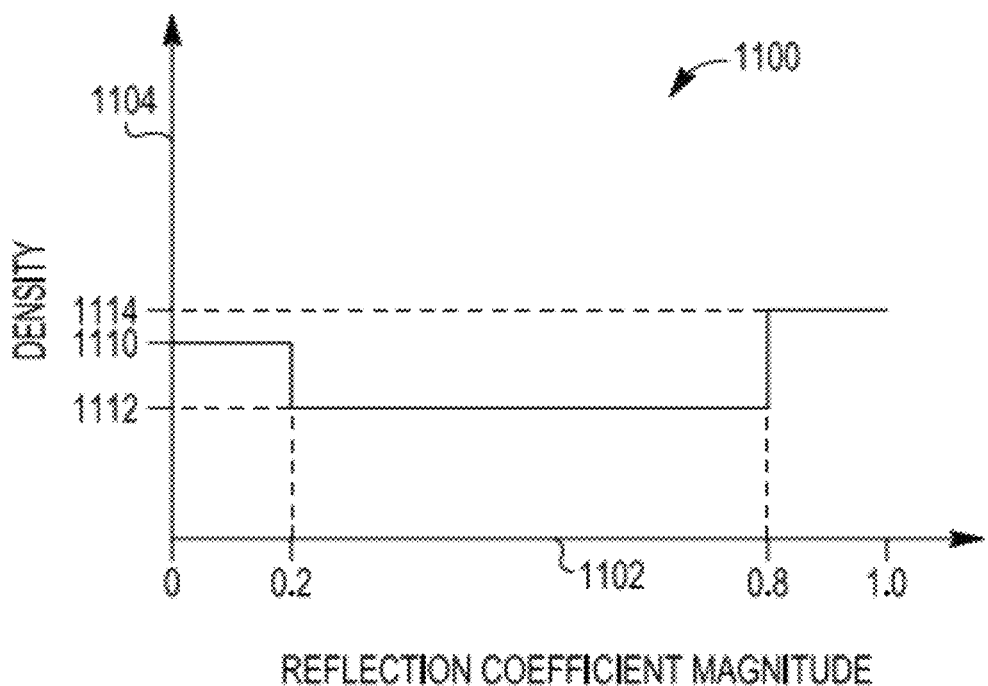
FIG. 11 illustrates a stepped density distribution plot corresponding to non-uniformly distributed, measured calibration points, which are relatively denser within both an central region and a peripheral region of a Smith chart, according to an example embodiment.

The density distribution plots illustrated in FIGS. 6, 8, and 10 are continuous (e.g., the plots have no significant discontinuities between $0<\gamma<1.0$). In alternate embodiments, density distribution plots may be discontinuous (e.g., "stepped"). For example, FIG. 11 illustrates a stepped density distribution plot 1100 corresponding to non-uniformly distributed, measured calibration points, which are relatively denser within both an central region and a peripheral region of a Smith chart, according to an example embodiment. More specifically, plot 1100 represents reflection coefficient (along axis 1102) versus calibration point density (axis 1104) for a plurality of non-uniformly distributed, measured calibration points. As FIG. 11 illustrates, the calibration point densities have a first average density 1110 within a central region of the Smith chart (e.g., at reflection coefficients between 0.0 and 0.2), a second average density 1112 within an intermediate region of the Smith chart (e.g., at reflection coefficients between 0.2 and 0.8), and a third average density 1114 within a peripheral region of the Smith chart (e.g., at reflection coefficients between 0.8 and 1.0). According to an embodiment, the first and third average densities 1110, 1114 are higher than the second average density 1112. The first and third average densities 1110, 1114 may or may not be equal, in various embodiments.

According to an embodiment, the relative densities of calibration points within the intermediate, center, and peripheral regions of the Smith chart may be defined by the following densification relationship:

$$d_I = x;$$

$$d_C = C_1 x; \text{ and}$$

$$d_P = C_2 x, \quad \text{(Equations 4)}$$

where $C_1$ is a first constant (e.g., $1.05 \leq C_1 \leq 5$), and $c_2$ is a second constant (e.g., $1.05 \leq C_2 \leq 5$). As indicated previously $C_1$ may or may not equal $C_2$. In alternate embodiments, $C_1$ and/or $C_2$ may have values above or below the example ranges given above, although both $C_1$ and $C_2$ will be greater than 1.0.

Finally, although FIG. 11 indicates a stepped density distribution plot in which calibration points are relatively denser within both a central region and a peripheral region of a Smith chart, alternate embodiments may have a stepped density distribution plot in which calibration points are relatively denser within either a central region or a peripheral region, but not both.

Although three concentric rings 310-312, 510-512, 710-712, 910-912 are illustrated in FIGS. 3, 5, 7, and 9, as few as two concentric rings or more than three concentric rings may be used to define various regions of a Smith chart.

Figure 12:
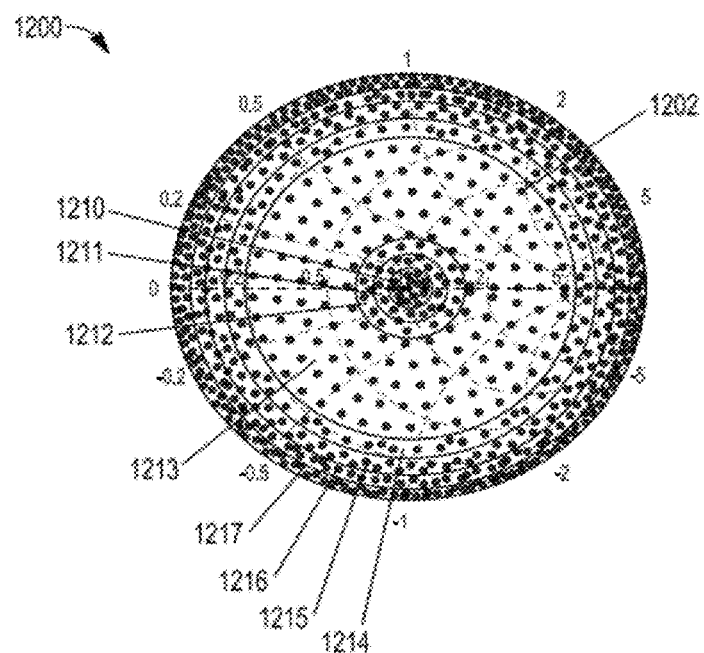
FIG. 12 illustrates an example of a Smith chart representing a plurality of non-uniformly distributed, measured calibration points, according to another example embodiment.

FIG. 12 illustrates an example of a Smith chart 1200 representing a plurality of non-uniformly distributed, measured calibration points 1202, according to another example embodiment. The number of uniformly distributed, measured calibration points 1202 may be, for example, in a range of about 50-100 calibration points, about 100-200 calibration points, about 200-500 calibration points, about 500-1000 calibration points, or more than 1000 calibration points.

Similar to the Smith charts 500, 700, 900 described in conjunction with FIGS. 5, 7, and 9, the measured calibration points 1202 depicted in FIG. 12 are non-uniformly distributed. In contrast with the Smith charts 500, 700, 900, however, a plurality of inner concentric rings 1210, 1211, 1212 and a plurality of outer concentric rings 1214, 1215, 1216, 1217 are defined for Smith chart 1200. The densities of the calibration points 1202 are different within each of the plurality of inner concentric rings 1210-1212, and the densities of calibration points 1202 are different within each of the plurality of outer concentric rings 1214-1217. In addition, calibration point densities within both the plurality of inner concentric rings 1210-1212 and the plurality of outer concentric rings 1214-1217 are higher than the density of the calibration points 1202 within the intermediate concentric ring 1213. In a particular embodiment, the densities of the calibration points 1202 within the inner and outer concentric rings 1210-1212 and 1214-1217 have a discontinuous relationship to each other.

According to an embodiment, an inner concentric ring (e.g., ring 1212) that is directly adjacent to the intermediate concentric ring 1213 has a first density, and traveling toward the center of the Smith chart, the densities for subsequent inner concentric rings (e.g., rings 1211 and 1210) increase incrementally. Accordingly, the density of the innermost inner concentric ring 1210 is the highest of the inner concentric rings 1210-1212. Similarly, an outer concentric ring (e.g., ring 1214) that is directly adjacent to the intermediate concentric ring 1213 has a second density, and traveling toward the perimeter of the Smith chart, the densities for subsequent outer concentric rings (e.g., rings 1215-1217) increase incrementally. Accordingly, the density of the outermost outer concentric ring 1217 is the highest of the outer concentric rings 1214-1217.

Figure 13:
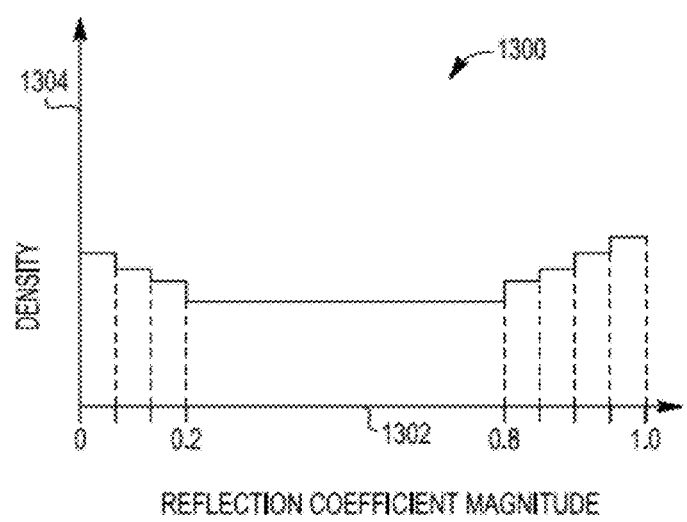
FIG. 13 illustrates a multiple-step density distribution plot corresponding to non-uniformly distributed, measured calibration points, which are relatively denser within a plurality of central regions and a plurality of peripheral regions of a Smith chart, according to another example embodiment.

FIG. 13 illustrates a multiple-step density distribution plot 1300 corresponding to non-uniformly distributed, measured calibration points, which are relatively denser within a plurality of central regions and a plurality of peripheral regions of a Smith chart, according to another example embodiment. More specifically, plot 1300 represents reflection coefficient (along axis 1302) versus calibration point density (axis 1304) for a plurality of non-uniformly distributed, measured calibration points. As FIG. 13 illustrates, the calibration point densities have a first average density 1310 within a central region of the Smith chart (e.g., at reflection coefficients between 0.0 and 0.2), increasingly large average densities within a plurality of central regions of the Smith chart (e.g., at reflection coefficients between 0.2 and 0.0), and increasingly large average densities within a plurality of peripheral regions of the Smith chart (e.g., at reflection coefficients between 0.8 and 1.0). According to an embodiment, the average densities within the plurality of inner and peripheral regions are higher than the average density within the central region.

Although FIGS. 12 and 13 illustrate an example in which three central regions (or inner concentric rings) and four peripheral regions (or outer concentric rings) are defined, it is to be understood that, in other embodiments, there may be more and/or fewer inner and/or peripheral regions. For example, another embodiment may include zero or one central regions and from two to over 1000 peripheral regions. Another embodiment may include zero or one peripheral regions and from two to over 1000 central regions. Yet another embodiment may include from two to over 1000 central regions and from two to over 1000 peripheral regions.

Figure 14:
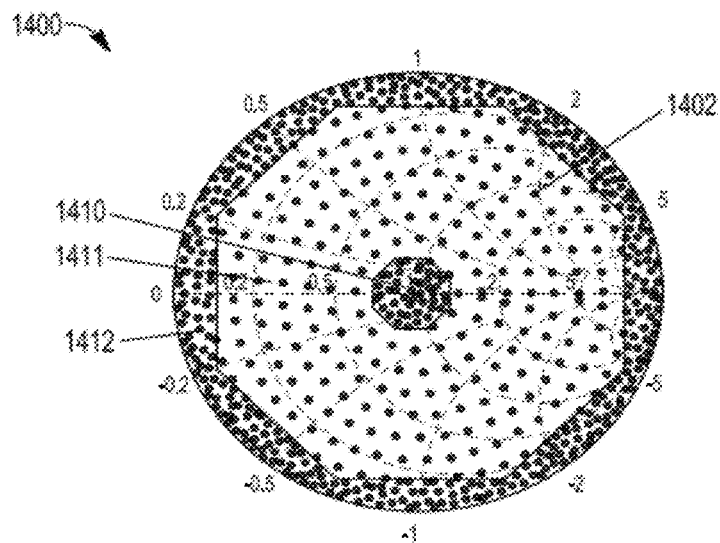
FIG. 14 illustrates an example of a Smith chart representing a plurality of non-uniformly distributed, measured calibration points, which are relatively denser within non-circular regions of the Smith chart, according to another example embodiment.

Although FIGS. 3, 5, 7, 9 and 12 depict regions of the Smith chart 300, 500, 700, 900, 1200 as concentric rings, in alternate embodiments, the regions of a Smith chart alternatively may be defined as a plurality of concentric polygons (e.g., hexagons, octagons, or other polygons) or other shapes. For example, FIG. 14 illustrates an example of a Smith chart 1400 representing a plurality of non-uniformly distributed, measured calibration points 1402, which are relatively denser within regions of the Smith chart having at least one hexagonal boundary, according to another example embodiment. More specifically, central region 1410 has a hexagonal perimeter, intermediate region 1411 has a hexagonal inner perimeter and a hexagonal outer perimeter, and peripheral region 1412 has a hexagonal inner perimeter and an outer perimeter corresponding to the perimeter of the Smith chart. According to an embodiment, the densities of the calibration points 1402 within both the central region 1410 and the peripheral region 1412 are higher than the density of the calibration points 1402 within the intermediate region 1411. FIG. 14 is provided to illustrate the concept that the differing density regions defined in a Smith chart may have shapes and/or perimeters other than ring and/or circular shapes. It is to be understood that, in other embodiments, shapes and/or perimeters may be non-circular and non-ring shapes other than the hexagonal alternate embodiment depicted in FIG. 14.

Figure 15:
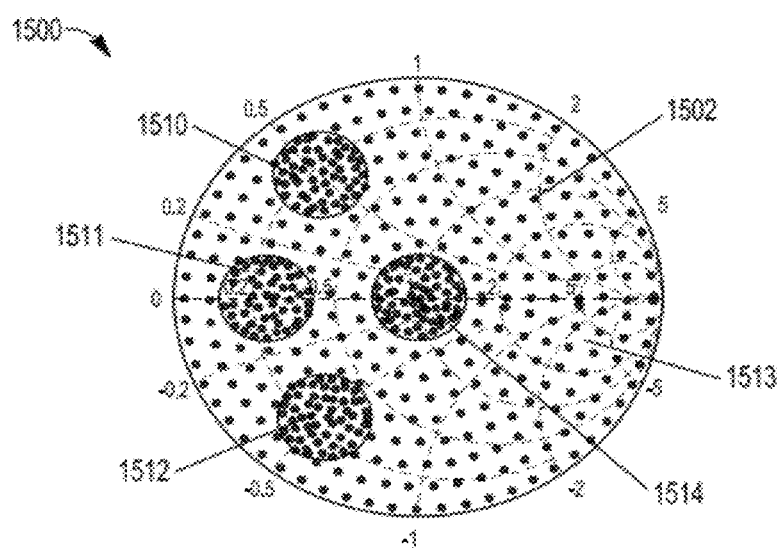
FIG. 15 illustrates an example of a Smith chart representing a plurality of non-uniformly distributed, measured calibration points, which are relatively denser within a plurality of non-concentric regions of the Smith chart, according to another example embodiment.

In still other alternate embodiments, regions of a Smith chart may be defined to include a plurality of non-overlapping, horizontal, vertical or radial slices of a Smith chart, or as a plurality of non-overlapping, regular or irregular geometrical elements (e.g., circles, ovals, rings, squares, rectangles, hexagons, and so on) defined across all or part of the surface of the Smith chart. In addition or alternatively, some or all of the differing density regions defined on the Smith chart may not be centered around the origin (i.e., γ=0) of the Smith chart (e.g., some of the regions may be non-concentric). For example, FIG. 15 illustrates an example of a Smith chart 1500 representing a plurality of non-uniformly distributed, measured calibration points 1502, which are relatively denser within a plurality of non-concentric regions 1510, 1511, 1512 of the Smith chart, according to another example embodiment. Accordingly, the density of calibration points 1502 within non-concentric regions 1510-1512 is relatively denser than the density of calibration points 1502 in a region 1513 defined outside of non-concentric regions 1510-1512. According to an embodiment, a central region 1514 also may be defined that has a relatively denser calibration point distribution than region 1513.

Figure 16:
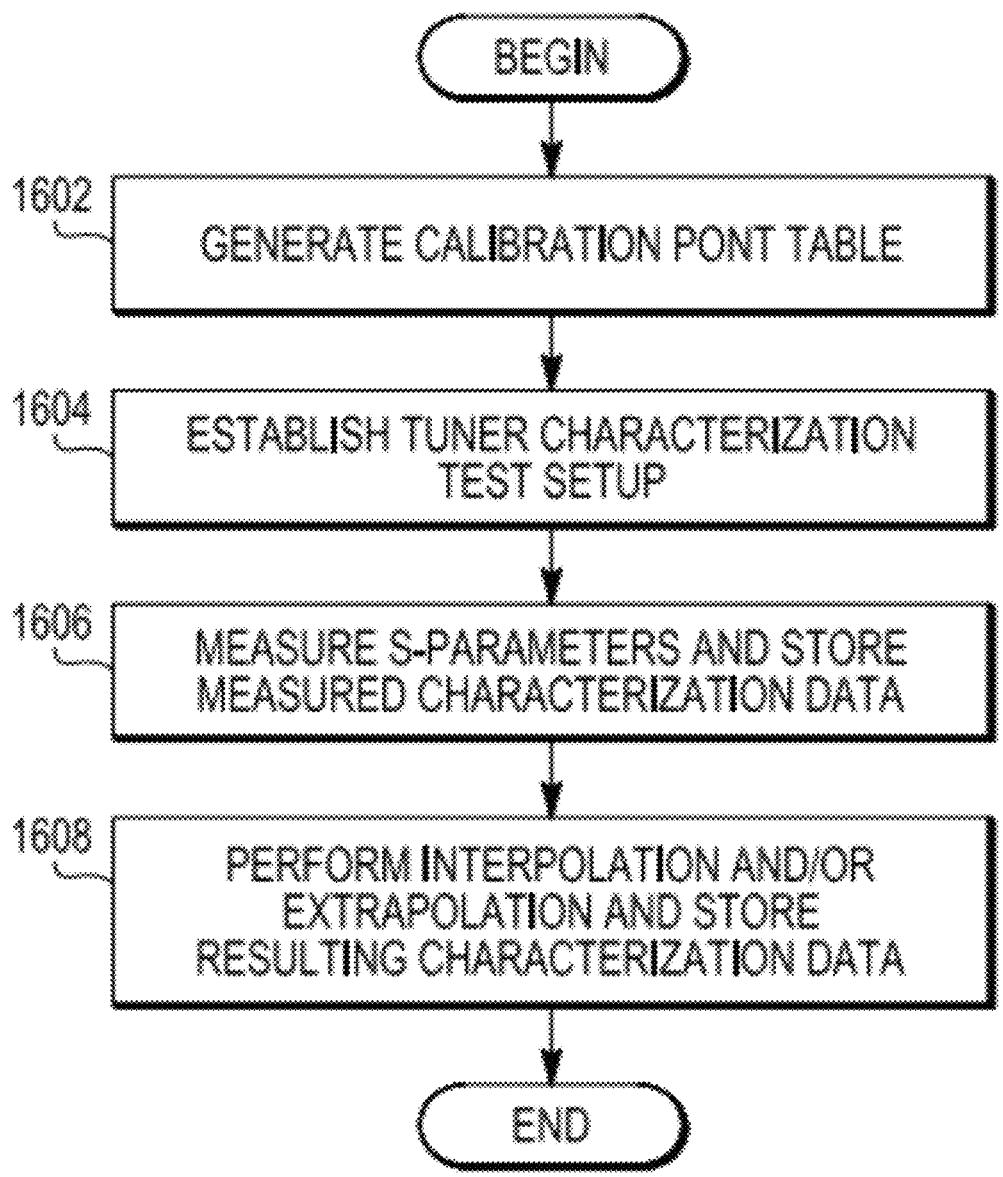
FIG. 16 is a flowchart of a method for characterizing a tuner, in accordance with an example embodiment.

FIG. 16 is a flowchart of a method for characterizing a tuner (e.g., tuner 102, FIG. 1), in accordance with an example embodiment. The method may begin, in block 1602, by generating a calibration point table having definitions for a plurality of measured calibration points that are non-uniformly distributed across the Smith chart. The calibration point table may be generated by a processing system (e.g., processing system 104, FIG. 1), and may be stored electronically (e.g., in data storage 106, FIG. 1) for later access by the processing system. Each measured calibration point of the table corresponds to an impedance point on a Smith chart, and may be represented by a position of a probe (e.g., probe 118, FIG. 1) or the positions of the motors associated with carriage and probe positioning mechanisms (e.g., mechanisms 114, 120, FIG. 1), for example. As discussed previously, the number of non-uniformly distributed, measured calibration points may be, for example, in a range of about 50-100 calibration points, about 100-200 calibration points, about 200-500 calibration points, about 500-1000 calibration points, or more than 1000 calibration points.

According to an embodiment, the plurality of measured calibration points is generated to be non-uniformly distributed by generating measured calibration points that are denser within one or more central regions (e.g., inner concentric circle 510, FIG. 5) of the Smith chart, and are less dense within intermediate and peripheral regions (e.g., intermediate and outer concentric circles 511, 512, FIG. 5) of the Smith chart. For example, the measured calibration points may have a densification relationship as discussed in conjunction with FIG. 6 and Equations 1, above.

According to another embodiment, the plurality of measured calibration points is generated to be non-uniformly distributed by generating measured calibration points that are denser within one or more peripheral regions (e.g., outer concentric circle 712, FIG. 7) of the Smith chart, and are less dense within central and intermediate regions (e.g., inner and intermediate concentric circles 710, 711, FIG. 7) of the Smith chart. For example, the measured calibration points may have a densification relationship as discussed in conjunction with FIG. 8 and Equations 2, above.

According to yet another embodiment, the plurality of measured calibration points is generated to be non-uniformly distributed by generating measured calibration points that are denser within both one or more central regions and one or more peripheral regions (e.g., inner and outer concentric circles 910, 912, FIG. 9) of the Smith chart, and are less dense within an intermediate region (e.g., intermediate concentric circle 911, FIG. 9) of the Smith chart. For example, the measured calibration points may have a densification relationship as discussed in conjunction with FIGS. 10, 11, and 13, and Equations 3 and 4, above. In alternate embodiments, the measured calibration points may have other non-uniform densification relationships.

In block 1604, a tuner characterization test set up is established. According to an embodiment, this includes connecting a vector network analyzer (e.g., VNA 108, FIG. 1) and a tuner (e.g., tuner 102, FIG. 1). More particularly, input and output ports of the VNA are connected with first and second ports (e.g., ports 150, 152, FIG. 1) on opposite ends of an airline (e.g., airline 122, FIG. 1) of the tuner. In addition, a processing system (e.g., processing system 104, FIG. 1) is connected to both the tuner and the VNA (e.g., as shown in FIG. 1).

In block 1606, S-parameters are measured for the plurality of non-uniformly distributed calibration points, and the measurements are stored as measured calibration data in a tuner characterization file. According to an embodiment, this includes the processing system retrieving the definitions for the plurality of non-uniformly distributed, measured calibration points (e.g., from data storage 106, FIG. 1), and controlling the carriage and probe of the tuner to positions corresponding to the calibration points. For each calibration point, the VNA measures S-parameters, and provides the S-parameter measurements to the processing system. The processing system then stores each set of measured S-parameters with its corresponding calibration point definition (i.e., as measured characterization data) in a tuner characterization file (e.g., in data storage 106, FIG. 1). As discussed previously, a separate tuner characterization file may be created for each test frequency, or a single tuner characterization file may be created that includes characterization data for multiple test frequencies.

In block 1608, interpolation and/or extrapolation processes may be performed, in order to generate a plurality of calibration points. The interpolation and/or extrapolation processes may include, for example, using linear or non-linear numerical interpolation and/or extrapolation routines (e.g., using LaGrange interpolation polynomials and/or thin plate spline surface modeling). The interpolation and extrapolation routines may be transformed to work in a coordinate system in which the phase of the reflection factor is controlled via horizontal movement of the tuner's carriage (e.g., carriage 112, FIG. 1), and the amplitude of the reflection factor is controlled via vertical movement of the tuner's probe (e.g., probe 118, FIG. 1). As discussed previously, the interpolated/extrapolated calibration points include calibration points located between and/or in proximity to the measured calibration points. According to an embodiment, the interpolation and/or extrapolation processes result in a plurality of calibration points (e.g., a combination of measured and interpolated/extrapolated calibration points) that are densely distributed across the Smith chart (e.g., as in the density of the calibration points 202, FIG. 2). The densely distributed calibration points may be substantially evenly distributed across the Smith chart, according to an embodiment. The interpolated/extrapolated calibration point definitions and their associated S-parameters (referred to together herein as "interpolated/extrapolated characterization data") may be stored (e.g., in data storage 106, FIG. 1) within a same tuner characterization file within which the measured characterization data is stored, according to an embodiment. Accordingly, a tuner characterization file for a particular tuner at a particular frequency includes definitions of both measured calibration points and interpolated/extrapolated calibration points. After generation of the interpolated/extrapolated calibration points, the method may then end.

The definitions of the measured and interpolated/extrapolated calibration points within the tuner characterization file may later be used during the testing of a DUT, as described previously. More particularly, characterized tuners may be connected to both the input and to the output of the DUT. The processing system may then access the calibration point definitions, and may cause each characterized tuner to present the corresponding impedances (or reflection coefficients) at the input and output of the DUT.

It is to be understood that certain ones of the process blocks depicted in FIG. 16 may be performed in parallel with each other or with performing other processes. In addition, it is to be understood that the particular ordering of the process blocks depicted in FIG. 16 may be modified, while achieving substantially the same result. Accordingly, such modifications are intended to be included within the scope of the inventive subject matter.

Thus, various embodiments of methods and apparatus for characterizing a tuner have been described. An embodiment includes a method for characterizing a tuner. The method comprises the steps of measuring scattering parameters for a plurality of characterization points that are non-uniformly distributed across a Smith chart, and storing the scattering parameters in a tuner characterization file.

A further embodiment of the method may also comprise the steps of performing an interpolation process and/or an extrapolation process to determine additional scattering parameters for a plurality of additional characterization points, and storing the additional scattering parameters in the tuner characterization file. According to a further embodiment, the plurality of characterization points includes from 50 to 1000 characterization points, and the plurality of additional characterization points includes from 1000 to 1,000,000 characterization points.

According to an embodiment, the plurality of characterization points include first characterization points in a central region of the Smith chart that are distributed at a first average density, and second characterization points between the central region and a perimeter of the Smith chart that are distributed at a second average density, and wherein the first average density is higher than the second average density. According to a further embodiment, the first average density is at least ten percent higher than the second average density. According to another further embodiment, the central region encompasses a center of the Smith chart, and the central region has a radius in a range of about 10 to 25 percent of a radius of the Smith chart.

According to an embodiment, the plurality of characterization points include first characterization points in an intermediate region of the Smith chart that are distributed at a first average density, and second characterization points in a peripheral region of the Smith chart that are distributed at a second average density, and wherein the second average density is higher than the first average density. According to a further embodiment, the second average density is at least ten percent higher than the first average density. According to another further embodiment, the peripheral region has an outer edge that substantially coincides with an outer perimeter of the Smith chart, and the peripheral region has a width in a range of about 10 to 25 percent of a radius of the Smith chart.

According to another embodiment, the plurality of characterization points include first characterization points, second characterization points, and third characterization points, wherein the first characterization points are located in a central region of the Smith chart and are distributed at a first average density, the second characterization points are located in an intermediate region of the Smith chart between the central region and a peripheral region, and the second characterization points are distributed at a second average density, and the third characterization points are located in the peripheral region of the Smith chart and are distributed at a third average density, and wherein the first average density and the third average density are higher than the second average density.

Another embodiment of a method for characterizing a tuner, comprises the steps of measuring scattering parameters for a plurality of characterization points that are non-uniformly distributed across a Smith chart, where the plurality of characterization points is more densely distributed in a first region of the Smith chart, and is less densely distributed in a second region of the Smith chart, and storing the scattering parameters in a tuner characterization file.

Another embodiment includes an apparatus for characterizing a load-pull tuner. The apparatus comprises a processing system adapted to measure scattering parameters for a plurality of characterization points that are non-uniformly distributed across a Smith chart, and to store the scattering parameters in a tuner characterization file, and data storage adapted to store the tuner characterization file in a retrievable format.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for characterizing a tuner, the method comprising the steps of:
   measuring scattering parameters for a plurality of characterization points that are non-uniformly distributed across a Smith chart, wherein the plurality of characterization points include first characterization points in a central region of the Smith chart that are distributed at a non-zero first average density, second characterization points in an intermediate region of the Smith chart between the central region and a peripheral region that are distributed at a non-zero second average density, and third characterization points in the peripheral region of the Smith chart that are distributed at a non-zero third average density, and wherein the first average density is higher than the second average density, and the third average density is higher than the second average density; and
   storing the scattering parameters in a tuner characterization file.

2. The method of claim 1, further comprising:
   performing an interpolation process and/or an extrapolation process to determine additional scattering parameters for a plurality of additional characterization points; and
   storing the additional scattering parameters in the tuner characterization file.

3. The method of claim 2, wherein the interpolation process and/or the extrapolation process include using linear or non-linear numerical interpolation and/or extrapolation routines to determine the additional scattering parameters.

4. The method of claim 2, wherein the plurality of characterization points includes from 50 to 1000 characterization points, and wherein the plurality of additional characterization points includes from 1000 to 1,000,000 characterization points.

5. The method of claim 1, wherein the first average density is at least ten percent higher than the second average density.

6. The method of claim 1, wherein the central region encompasses a center of the Smith chart, and the central region has a radius in a range of about 10 to 25 percent of a radius of the Smith chart.

7. A method for characterizing a tuner, the method comprising the steps of:
   measuring scattering parameters for a plurality of characterization points that are non-uniformly distributed across a Smith chart, wherein the plurality of characterization points include first characterization points in an intermediate region of the Smith chart between a central region and a peripheral region that are distributed at a non-zero first average density, second characterization points in the peripheral region of the Smith chart that are distributed at a non-zero second average density, and third characterization points in the central region of the Smith chart that are distributed at a non-zero third average density, and wherein the second average density is higher than the first average density, and the third average density is higher than the first average density; and
   storing the scattering parameters in a tuner characterization file.

8. The method of claim 7, wherein the second average density is at least ten percent higher than the first average density.

9. The method of claim 7, wherein the peripheral region has an outer edge that substantially coincides with an outer perimeter of the Smith chart, and the peripheral region has a width in a range of about 10 to 25 percent of a radius of the Smith chart.

10. The method of claim 1, further comprising accessing the scattering parameters in the tuner characterization file during testing of a device under test.

11. A method for characterizing a tuner, the method comprising the steps of:
    measuring scattering parameters for a plurality of characterization points that are non-uniformly distributed across a Smith chart, wherein the plurality of characterization points includes first characterization points in a first region of the Smith chart, second characterization points in a second region of the Smith chart, and third characterization points in a third region of the Smith chart, wherein the first characterization points are more densely distributed in the first region of the Smith chart, the second characterization points are less densely distributed in the second region of the Smith chart, and the third characterization points are more densely distributed in the third region of the Smith chart, and wherein the first region of the Smith chart includes a central region of the Smith chart, the second region of the Smith chart includes an intermediate region between the first region and a peripheral region of the Smith chart, and the third region of the Smith chart includes the peripheral region of the Smith chart; and
    storing the scattering parameters in a tuner characterization file.

12. The method of claim 11, further comprising:
    performing an interpolation process and/or an extrapolation process to determine additional scattering parameters for a plurality of additional characterization points; and
    storing the additional scattering parameters in the tuner characterization file.

13. The method of claim 11, wherein the characterization points are distributed at a non-zero first average density in the first region and at a non-zero second average density in the second region, and wherein the first average density is at least ten percent higher than the second average density.

14. The method of claim 11, wherein the characterization points are distributed at a non-zero first average density in the first region and at a non-zero second average density in the second region, and wherein the first average density is at least fifty percent higher than the second average density.

15. An apparatus for characterizing a load-pull tuner, the apparatus comprising:

a processing system adapted to measure scattering parameters for a plurality of characterization points that are non-uniformly distributed across a Smith chart, and to store the scattering parameters in a tuner characterization file, wherein the plurality of characterization points include first characterization points in a central region of the Smith chart that are distributed at a non-zero first average density, second characterization points in an intermediate region of the Smith chart between the central region and a peripheral region that are distributed at a non-zero second average density, and third characterization points in the peripheral region of the Smith chart that are distributed at a non-zero third average density, and wherein the first average density is higher than the second average density, and the third average density is higher than the second average density; and data storage adapted to store the tuner characterization file in a retrievable format.

16. The apparatus of claim 15, wherein the processing system is further adapted to perform an interpolation process and/or an extrapolation process to determine additional scattering parameters for a plurality of additional characterization points, and to store the additional scattering parameters in the tuner characterization file.

17. An apparatus for characterizing a load-pull tuner, the apparatus comprising:

a processing system adapted to measure scattering parameters for a plurality of characterization points that are non-uniformly distributed across a Smith chart, and to store the scattering parameters in a tuner characterization file, wherein the plurality of characterization points include first characterization points in an intermediate region of the Smith chart between a central region and a peripheral region that are distributed at a non-zero first average density, second characterization points in the peripheral region of the Smith chart that are distributed at a non-zero second average density, and third characterization points in the central region of the Smith chart that are distributed at a non-zero third average density, and wherein the second average density is higher than the first average density, and the third average density is higher than the first average density; and data storage adapted to store the tuner characterization file in a retrievable format.

* * * * *